(12) United States Patent
Yoshida

(10) Patent No.: US 11,981,059 B2
(45) Date of Patent: May 14, 2024

(54) CONVEYING APPARATUS AND RESIN MOLDING APPARATUS

(71) Applicant: TOWA CORPORATION, Kyoto (JP)

(72) Inventor: Syuhei Yoshida, Kyoto (JP)

(73) Assignee: Towa Corporation (JP)

( * ) Notice: Subject to any disclaimer, the term of this patent is extended or adjusted under 35 U.S.C. 154(b) by 245 days.

(21) Appl. No.: 17/285,770

(22) PCT Filed: Aug. 22, 2019

(86) PCT No.: PCT/JP2019/032926
§ 371 (c)(1),
(2) Date: Apr. 15, 2021

(87) PCT Pub. No.: WO2020/079954
PCT Pub. Date: Apr. 23, 2020

(65) Prior Publication Data
US 2021/0387385 A1 Dec. 16, 2021

(30) Foreign Application Priority Data
Oct. 16, 2018 (JP) ................. 2018-194850

(51) Int. Cl.
B29C 45/04 (2006.01)
B29C 45/14 (2006.01)
(Continued)

(52) U.S. Cl.
CPC .... B29C 45/14065 (2013.01); B29C 45/0408 (2013.01); B29C 45/14639 (2013.01); B29C 45/1769 (2013.01); B29L 2031/34 (2013.01)

(58) Field of Classification Search
CPC .......... B29C 45/14065; B29C 45/0408; B29C 45/14639; B29C 45/1769
See application file for complete search history.

(56) References Cited

U.S. PATENT DOCUMENTS

2006/0131780 A1 6/2006 Kuno et al.

FOREIGN PATENT DOCUMENTS

CN 105006438 A 10/2015
CN 105228805 A 1/2016
(Continued)

OTHER PUBLICATIONS

Office Action dated Nov. 12, 2019 issued for Japanese patent application No. 2018-194850, 7 pgs.
(Continued)

Primary Examiner — Edmund H Lee
(74) Attorney, Agent, or Firm — Brooks Kushman P.C.

(57) ABSTRACT

The present invention relates to a conveyance device with which a subject to be molded can be positioned relative to a forming die. This conveyance device conveys a subject to be molded to one die from among forming dies to which a resin material is supplied from a resin injection part and comprises a retaining unit which retains and delivers the subject to be molded to the one die, a first movement mechanism which moves the subject to be molded having been delivered to the one die in a first direction toward the resin injection part, and a second movement mechanism which moves the subject to be molded having been delivered to the one die in a second direction differing from the first direction.

14 Claims, 16 Drawing Sheets

(51) Int. Cl.
*B29C 45/17* (2006.01)
*B29L 31/34* (2006.01)

(56) References Cited

FOREIGN PATENT DOCUMENTS

| | | | |
|---|---|---|---|
| CN | 105690653 | * | 6/2016 |
| CN | 107972220 A | | 5/2018 |
| JP | 2004314338 | * | 11/2004 |
| JP | 2009-166382 A | | 7/2009 |
| JP | 2014-008761 A | | 1/2014 |
| JP | 2016-192500 A | | 11/2016 |

OTHER PUBLICATIONS

International Search Report dated Nov. 19, 2019 issued for International application No. PCT/JP2019/032926, 2 pgs.
Decision to grant a patent dated Jan. 14, 2020 issued for Japanese patent application No. 2018-194850, 6 pgs.
Office Action dated Apr. 27, 2020 issued for Taiwanese patent application No. 108135304, 4 pgs.
Decision to grant a patent dated Aug. 25, 2020 issued for Taiwanese patent application No. 108135304, 2 pgs.
Office Action dated Jul. 1, 2023 issued in CN patent application No. 201980067730.4.

* cited by examiner

CONVEYING APPARATUS AND RESIN MOLDING APPARATUS

CROSS-REFERENCE TO RELATED APPLICATIONS

This application is the U.S. national phase of PCT Application No. PCT/JP2019/032926, filed Aug. 22, 2019, which claims priority to Japanese Patent Application No. 2018-194850, filed Oct. 16, 2018, which are both incorporated by reference herein in their entireties.

TECHNICAL FIELD

The present invention relates to a conveying apparatus, a resin molding apparatus, a conveying method, and a resin molded product manufacturing method.

TECHNICAL BACKGROUND

Conventionally, in a resin molding apparatus that includes a first mold in which is formed a pot into which resin is placed, and a second mold in which is formed a cavity into which the resin placed in the pot is injected, a positioning pin that is used to position a substrate is provided in the first mold. By inserting this positioning pin into a hole formed in the substrate, positioning of the substrate relative to the forming mold is achieved (see, for example, Patent Document 1).

DOCUMENTS OF THE PRIOR ART

Patent Documents

[Patent Document 1] Japanese Unexamined Patent Application Laid-Open (JP-A) No. 2016-192500

DISCLOSURE OF THE INVENTION

Problems to be Solved by the Invention

However, due to factors relating to cost reductions or substrate conveying and the like, there are cases in which it is not possible to provide positioning pins in the forming mold, or to provide positioning holes in the object being molded.

The present invention was conceived in order to solve the above-described drawbacks, and it is a principal object thereof to enable an object being molded to be positioned relative to a forming mold.

Means for Solving the Problem

In other words, a conveying apparatus according to the present invention is a conveying apparatus that conveys an object being molded to one mold from among forming molds to which a resin material is supplied from a resin injection portion, and is characterized in being provided with a holding unit that holds the object being molded and transfers it to the one mold, a first moving mechanism that moves the object being molded which has been transferred to the one mold in a first direction towards the resin injection portion side, and a second moving mechanism that moves the object being molded which has been transferred to the one mold in a second direction that is different from the first direction.

Effects of the Invention

According to the present invention which is formed in this manner, an object being molded can be positioned relative to a forming mold by a conveying apparatus.

DESCRIPTION OF THE REFERENCE NUMERALS

Figure 1:
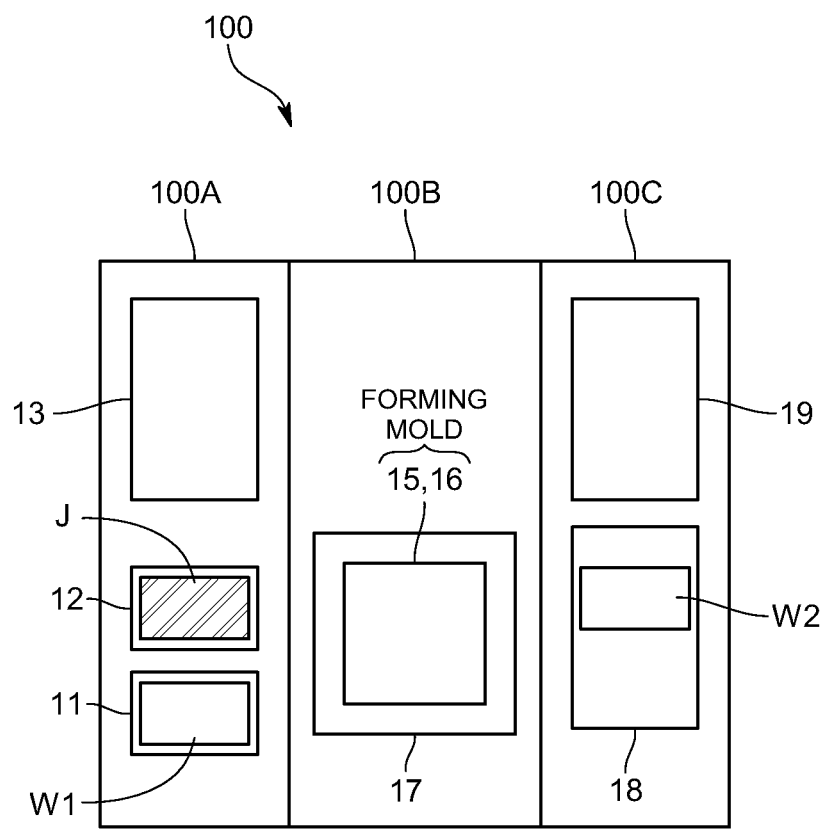
FIG. 1 is a schematic view showing a structure of a resin molding apparatus according to an embodiment of the present invention.

100 . . . Resin Molding Apparatus
W1 . . . Object being molded Prior to Molding
W2 . . . Object being molded After Molding (Resin Molded Product)
J . . . Resin Material
13 . . . Conveying Apparatus
14 . . . Resin Injection Portion 15 . . . One Mold (Lower Mold)
16 . . . Other Mold (Upper Mold)
20 . . . Holding Unit
21 . . . First Moving Mechanism
211 . . . First Contact Portion
212 . . . First Drive Portion
213 . . . First Elastic Component
22 . . . Second Moving Mechanism
221 . . . Second Contact Portion
23 . . . Cam Portion
233 . . . Second Elastic Component
203 . . . Pressing Component
204 . . . Vertical Movement Mechanism
205 . . . Resin Holding Unit
24 . . . Position Regulating Component

BEST EMBODIMENTS FOR IMPLEMENTING THE INVENTION

Next, the present invention will be described in further detail using examples. It should be noted, however, that the present invention is not limited by the following description.

As is described above, the conveying apparatus of the present invention conveys an object being molded to one mold from among forming molds to which a resin material is supplied from a resin injection portion, and is characterized in being provided with a holding unit that holds the object being molded and transfers it to the one mold, a first moving mechanism that moves the object being molded which has been transferred to the one mold in a first direction towards the resin injection portion side, and a second moving mechanism that moves the object being molded which has been transferred to the one mold in a second direction that is different from the first direction.

If this conveying apparatus is employed, because the conveying apparatus is provided with the first moving mechanism that moves the object being molded in a first direction towards the resin injection portion side, and the second moving mechanism that moves the object being molded in a second direction that is different from the first direction, it is possible to position the object being molded relative to the forming mold without having to provide positioning pins in the forming mold in order to position the object being molded, and without having to provide positioning holes in the object being molded in order to position it relative to the forming mold. As a result, it is possible to achieve a reduction in the cost of the forming mold, and a shortening of the manufacturing time and the like. Additionally, because the object being molded which has been positioned by the conveying apparatus can be resin sealed, it is possible to reduce the occurrence of resin burrs, and to thereby manufacture a higher quality resin molded product.

As a specific embodiment of the first moving mechanism and the second moving mechanism, it is desirable that the first moving mechanism include a first contact portion that is provided in the holding unit so as to be able to move in the first direction, and that comes into contact with the object being molded, and a first drive portion that causes the first contact portion to move in the first direction, and that the second moving mechanism include a second contact portion that is provided in the holding unit so as to be able to move in the second direction, and that comes into contact with the object being molded, and a second drive portion that causes the second contact portion to move in the second direction.

In addition, it is desirable that the first moving mechanism include a first contact portion that is provided in the holding unit so as to be able to move in the first direction, and that comes into contact with the object being molded, and a first drive portion that causes the first contact portion to move in the first direction, and that the second moving mechanism include a second contact portion that is provided in the holding unit so as to be able to move in the second direction, and that comes into contact with the object being molded, and that the second moving mechanism use the first drive portion to move the second contact portion in the second direction.

If this structure is employed, because the drive portion of the first moving mechanism and the drive portion of the second moving mechanism are the same, not only can the structure be simplified, but a reduction in costs can also be achieved.

As a specific embodiment in order to enable the second contact portion to be moved in the second direction using the first drive portion of the first moving mechanism, it is desirable that the second moving mechanism include a cam portion that converts a movement generated by the first drive portion in the first direction into a movement in the second direction.

If this structure is employed, because it is possible to convert a movement generated by the first drive portion in the first direction into a movement in the second direction, the apparatus structure can be simplified.

It is additionally desirable that the first moving mechanism include a first elastic component that is elastically deformed in conjunction with the movement of the first contact portion in the first direction.

If this structure is employed, it is possible to position the object being molded in the first direction while absorbing any unevenness in the amount of movement of the first contact portion, and also any dimensional irregularities in the object being molded.

It is also desirable that the second moving mechanism include a second elastic component that is elastically deformed in conjunction with the movement of the second contact portion in the second direction.

If this structure is employed, it is possible to position the object being molded in the second direction while absorbing any unevenness in the amount of movement of the second contact portion, and also any dimensional irregularities in the object being molded.

In a case in which the resin injection portion provided on the one mold side is provided so as to protrude from a molding surface of this one mold, it is desirable that the first moving mechanism position the object being molded by placing an end surface thereof in contact with an end surface of the resin injection portion.

In a case in which the resin injection portion provided on the one mold side does not protrude from a molding surface of this one mold, it is desirable that there be further provided a position regulating component that regulates a position in the first direction by being in contact with the object being molded which is moved in the first direction by the first moving mechanism.

In order to inhibit any flexure in an object being molded that has been transferred to the one mold, it is desirable that the conveying apparatus be further provided with a pressing component that presses against the object being molded which has been transferred to the one mold, and a vertical movement mechanism that raises or lowers the pressing component relative to the object being molded.

In this structure, in order to inhibit any flexure in the object being molded while the object being molded is being positioned, it is desirable that the vertical movement mechanism be used to bring the pressing component adjacent to the object being molded which is positioned by the first moving mechanism and the second moving mechanism.

It is also desirable that the first contact portion be provided in the pressing component, and that the first drive portion cause the first contact portion to move by moving the pressing component in the first direction.

If this structure is employed, because the same drive portion can be used to drive both the first contact portion and the pressing component in the first direction, a simplification of the structure can be achieved.

It is also desirable that the holding unit include a resin holding portion that holds resin that is supplied to the resin injection portion, and that the resin is supplied to the resin injection portion as a result of the holding unit being moved.

In this structure, when the resin is being supplied to the resin injection portion, it is desirable that the vertical movement mechanism move the pressing component to a position where the pressing component is not in contact with the object being molded.

In addition, the resin molding apparatus according to the present invention is characterized in having the above-described conveying apparatus.

If this resin molding apparatus is employed, then because it is possible to resin-seal an object being molded that has been positioned by a conveying apparatus, the occurrence of resin burrs can be reduced, and it is possible to manufacture a high-quality resin molded product.

Furthermore, a conveying method for an object being molded according to the present invention is characterized in that, using the above-described conveying apparatus, the object being molded which has been transferred to the one mold is moved in a first direction towards the resin injection portion side, and the object being molded is then positioned in the one mold by being moved in a second direction that is different from the first direction.

In addition, a resin molded product manufacturing method according to the present invention is a resin molded product manufacturing method in which an electronic component is resin sealed by means of resin molding, and is characterized in being provided with a positioning step in which the object to be molded is positioned in the one mold by the above-described conveying apparatus, and a molding step in which the object to be molded undergoes resin molding after having been positioned in the one mold.

If this resin molded product manufacturing method is employed, it is possible to position the object being molded relative to the forming mold without having to provide positioning pins in the forming mold in order to position the object being molded, and without having to provide positioning holes in the object being molded in order to position it relative to the forming mold. As a result, it is possible to achieve a reduction in the cost of the forming mold, and a shortening of the manufacturing time and the like. Additionally, because the object being molded which has been positioned by the conveying apparatus can be resin sealed, it is possible to reduce the occurrence of resin burrs, and to thereby manufacture a higher quality resin molded product.

Embodiment of the Present Invention

Hereinafter, an embodiment of a resin molding apparatus according to the present invention will be described with reference to the drawings. Note that each of the drawings shown below has been drawn schematically with omissions or enhancements being employed where appropriate in order to make the drawings easier to understand. In addition, component elements that are mutually the same are given the same descriptive symbols and any duplicated description thereof is omitted.

[Overall Structure of a Resin Molding Apparatus]

A resin molding apparatus 100 of the present embodiment performs resin molding on an object being molded W1 on which electronic components Wx have been packaged by performing transfer molding thereon using a resin material J.

Here, the object being molded W1 may be, for example, a metal substrate, a resin substrate, a glass substrate, a ceramic substrate, a circuit substrate, a semiconductor substrate, a wiring substrate, or a lead frame or the like, and may either include or not include wiring. The resin material J used for the resin molding may, for example, be a composite material containing a thermosetting resin, and the resin material J may be in granular form, powder form, liquid form, sheet form, or in tablet form or the like. Examples of the electronic components Wx packaged on an upper surface of the object being molded W1 include bare chips and resin sealed chips.

More specifically, as is shown in FIG. 1, the resin molding apparatus 100 is provided with various component elements including a supply module 100A that supplies objects being molded W1 before molding and also the resin material J, a molding module 100B that performs the resin molding, and a storage module 100C that stores objects being molded W2 after the molding (hereinafter, these are referred to as resin molded products W2). Note that each of the supply module 100A, the molding module 100B, and the storage module 100C is able to be combined with or separated from the other component elements, and is also replaceable.

The supply module 100A is provided with an object being molded supply portion 11 that supplies the objects being molded W1, a resin material supply portion 12 that supplies the resin material J, and a conveying apparatus 13 (hereinafter, referred to as a loader 13) that receives the objects being molded W1 from the object being molded supply portion 11 and conveys them to the molding module 100B, and also receives the resin material J from the resin material supply portion 12 and conveys it to the molding module 100B.

The loader 13 moves back and forth between the supply module 100A and the molding module 100B, and performs this by moving along rails (not shown in the drawings) which are provided between the supply module 100A and the molding module 100B. Note that the loader 13 is described below in further detail.

As is shown in FIG. 2 through FIG. 6, the molding module 100B has one mold 15 (hereinafter, referred to as a lower mold 15) of a forming mold in which a resin injection portion 14 is provided, another mold 16 (hereinafter, referred to as an upper mold 16) of the forming mold which is provided so as to face the lower mold 15 and in which is formed a cavity 16a into which the resin material J is injected, and a mold clamping mechanism 17 that clamps the lower mold 15 and the upper mold 16 together. The lower mold 15 is provided via a lower platen 102 on a movable plate 101 that is raised and lowered by the mold clamping mechanism 17. The upper mold 16 is provided via an upper platen 103 in an upper fixed plate (not shown in the drawings).

The resin injection portion 14 of the present embodiment has a cull block 141 in which is formed a pot 141a that contains the resin material J, a plunger 142 that pumps out the resin material J contained in the pot 141a, and a plunger drive portion 143 that drives the plunger 142. Note that the plunger 142 pumps out the resin material J after this has been heated in the pot 141a so as to become molten.

The cull block 141 is provided in a recessed portion 15M formed in the lower mold 15, and is elastically supported by an elastic component 144 so as to be able to move up and down inside the recessed portion 15M. In addition, a protruding portion 141b that protrudes outwards beyond an aperture of the recessed portion 15M is formed in an upper end portion of the cull block 141.

A cavity 16a that contains the electronic components Wx of the object being molded W1 and into which the molten resin material J is injected is formed in the upper mold 16. In addition, a cull 16b, which is a recessed portion, is formed in a portion of the upper mold 16 that faces the protruding portion 141b of the cull block 141, and a runner 16c that connects the cull 16b to the cavity 16a is also formed in the upper mold 16. Note that, although not shown in the drawings, an air vent is formed in the upper mold 16 on the opposite side from the cull block 141.

Figure 4:
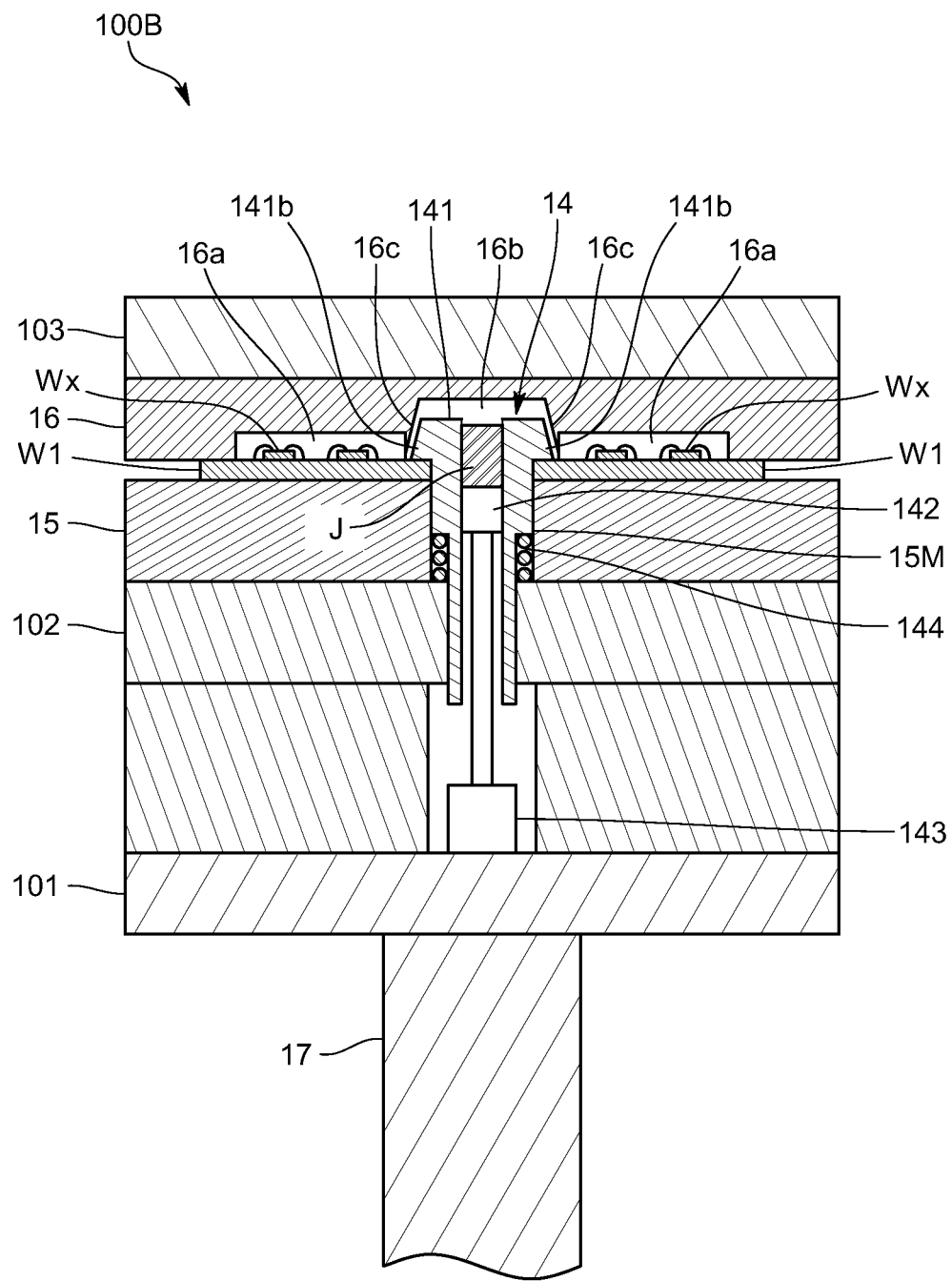
FIG. 4 is a schematic view showing a mold fastened state of the molding module of the same embodiment.

Moreover, as is shown in FIG. 4, when the lower mold 15 and the upper mold 16 are clamped together by the mold clamping mechanism 17, a resin flow path formed by the cull 16b and the runner 16c connects the pot 141a to the cavity 16a. In addition, when the lower mold 15 and the upper mold 16 are clamped together, a pot-side end portion of the object being molded W1 is sandwiched between a lower surface of the protruding portion 141b of the cull block 141 and an upper surface of the lower mold 15. In this state, if the molten resin material J is injected into the cavity 16a by the plunger 142, then the electronic components Wx of the object being molded W1 are resin sealed.

The storage module 100C is provided with a storage portion 18 that stores the resin molded products W2, and a conveying apparatus 19 (hereinafter, referred to as an unloader 19) that receives the resin molded products W2 from the molding module 100B and conveys them to the storage portion 18.

The unloader 19 moves back and forth between the molding module 100B and the storage module 100C, and performs this by moving along rails (not shown in the drawings) provided between the molding module 100B and the storage module 100C.

A simple description of basic operations of this resin molding apparatus 100 will now be given with reference to FIG. 2 through FIG. 6.

Figure 2:
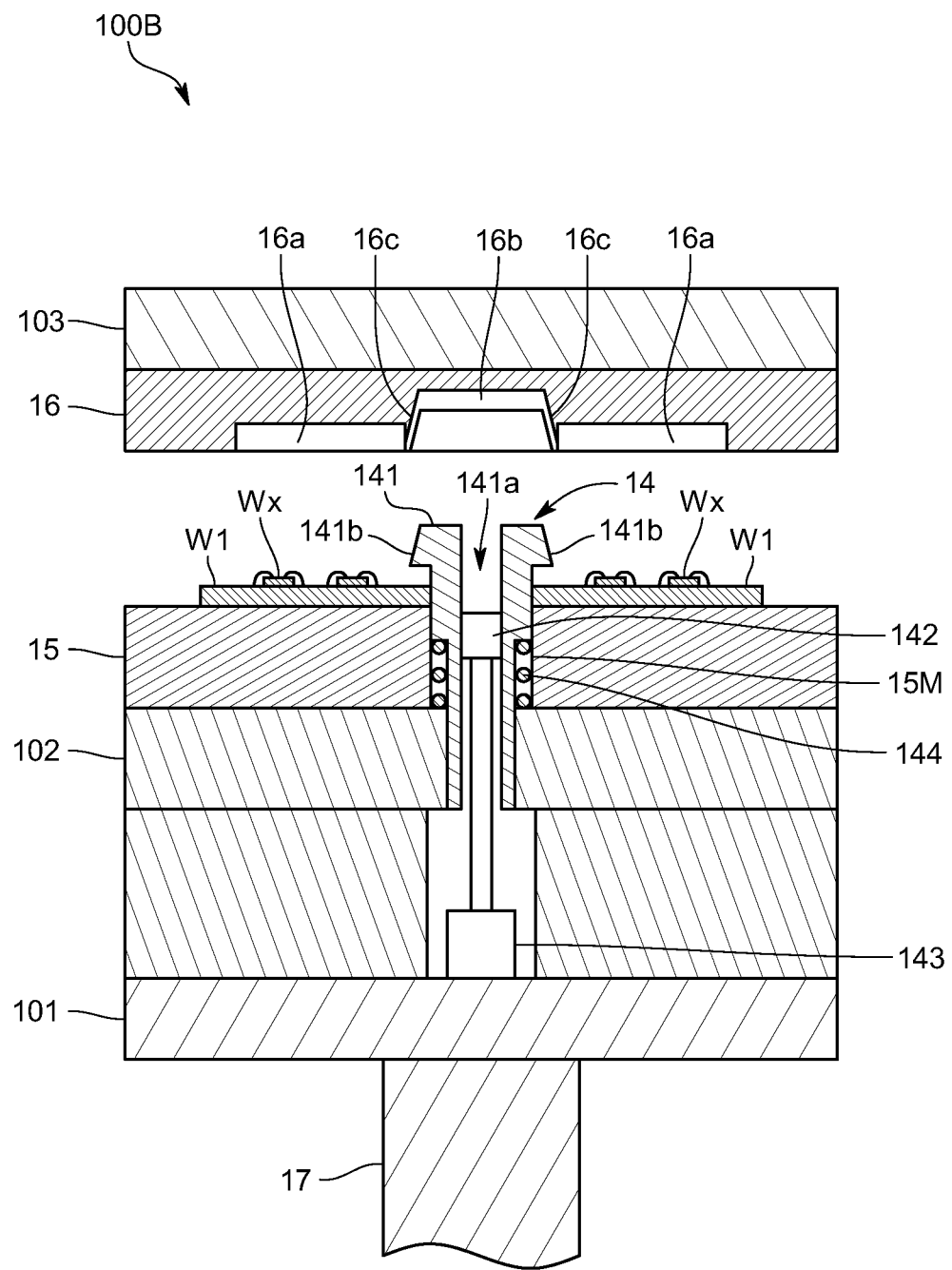
FIG. 2 is a schematic view showing a substrate placement state of a molding module of the same embodiment.
Figure 3:
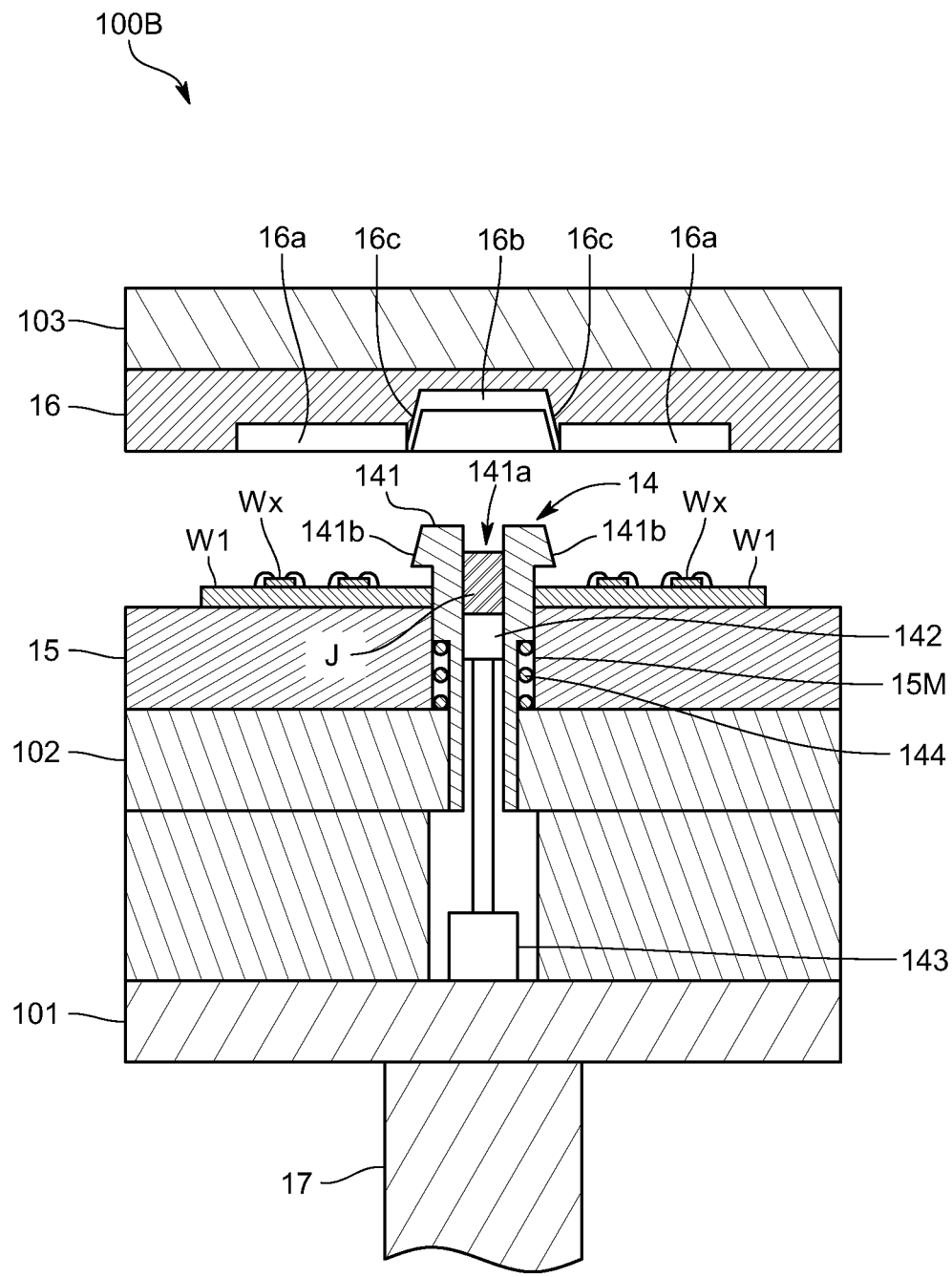
FIG. 3 is a schematic view showing a resin material loaded state of the molding module of the same embodiment.

As is shown in FIG. 2, in a state in which the lower mold 15 and the upper mold 16 are open, an object being molded W1 before molding is conveyed by the loader 13, and is then transferred to the lower mold 15 and placed thereon. At this time, the upper mold 16 and the lower mold 15 have been heated to a temperature that enables the resin material J to be melted and cured. Thereafter, as is shown in FIG. 3, the resin material J is conveyed by the loader 13 and is then held within the pot 141a of the cull block 141.

Figure 5:
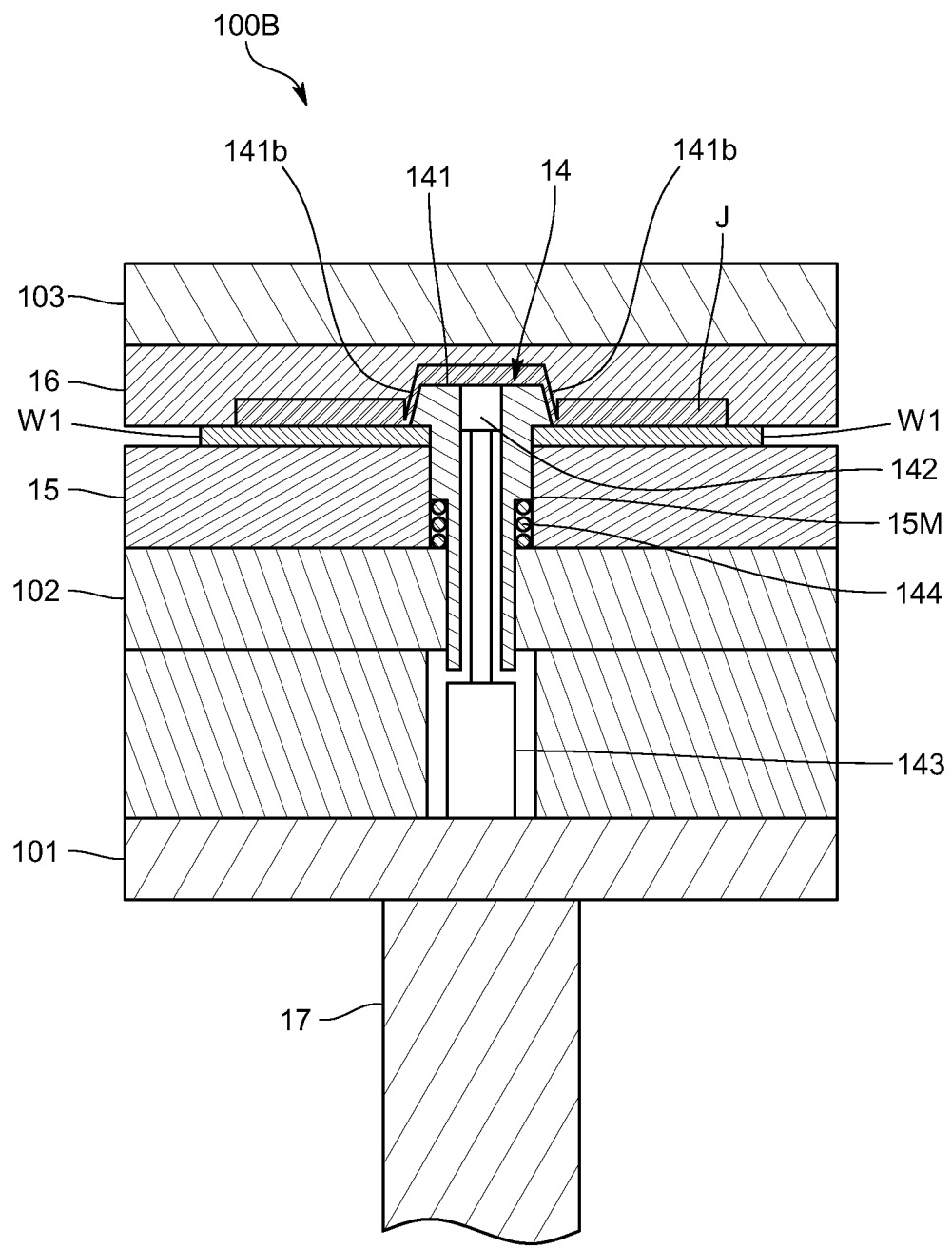
FIG. 5 is a schematic view showing a resin injected state of the molding module of the same embodiment.
Figure 6:
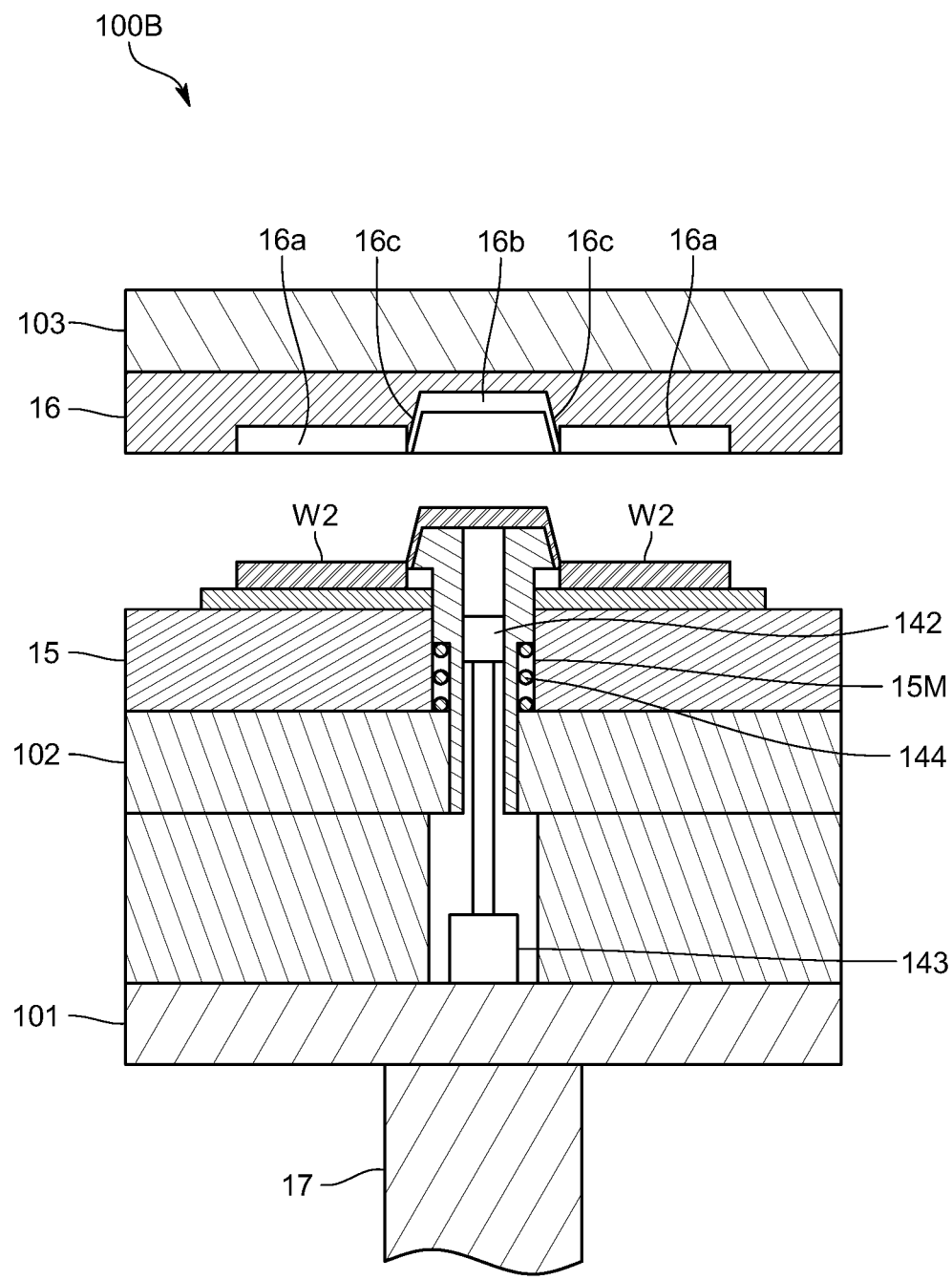
FIG. 6 is a schematic view showing a mold opened state of the molding module of the same embodiment.

If, in this state, the lower mold 15 is raised by the mold clamping mechanism 17, then as is shown in FIG. 4, the cull block 141 hits against the upper mold 16 and is lowered down within the recessed portion 15M of the lower mold 15, so that the lower surface of the protruding portion 141b comes into contact with the pot-side end portion of the object being molded W1. In addition, the lower surface of the upper mold 16 comes into contact with the vent-side end portion of the object being molded W1. As a result, the lower mold 15 and the upper mold 16 are clamped together. Once they are clamped together, if the plunger 142 is then raised by the plunger drive portion 143, then as is shown in FIG. 5, the molten resin material J inside the pot 141a passes through the resin flow path and is injected into the cavity 16a. After the resin material J has subsequently cured inside the cavity 16a, then as is shown in FIG. 6, the mold is opened by the mold fastening mechanism 17, and the resin molded product W2 is conveyed away by the unloader 19, and is transported to the storage portion 18.

[Specific Structure of the Loader 13]

Next, the specific structure of the loader 13 of the present embodiment will be described with reference to FIG. 7 through FIG. 14. Note that, in FIG. 7 through FIG. 14, the electronic components Wx have been omitted from the drawings. Moreover, in FIG. 11 through FIG. 14, conveying claws 202a have also been omitted from the drawings.

Figure 7:
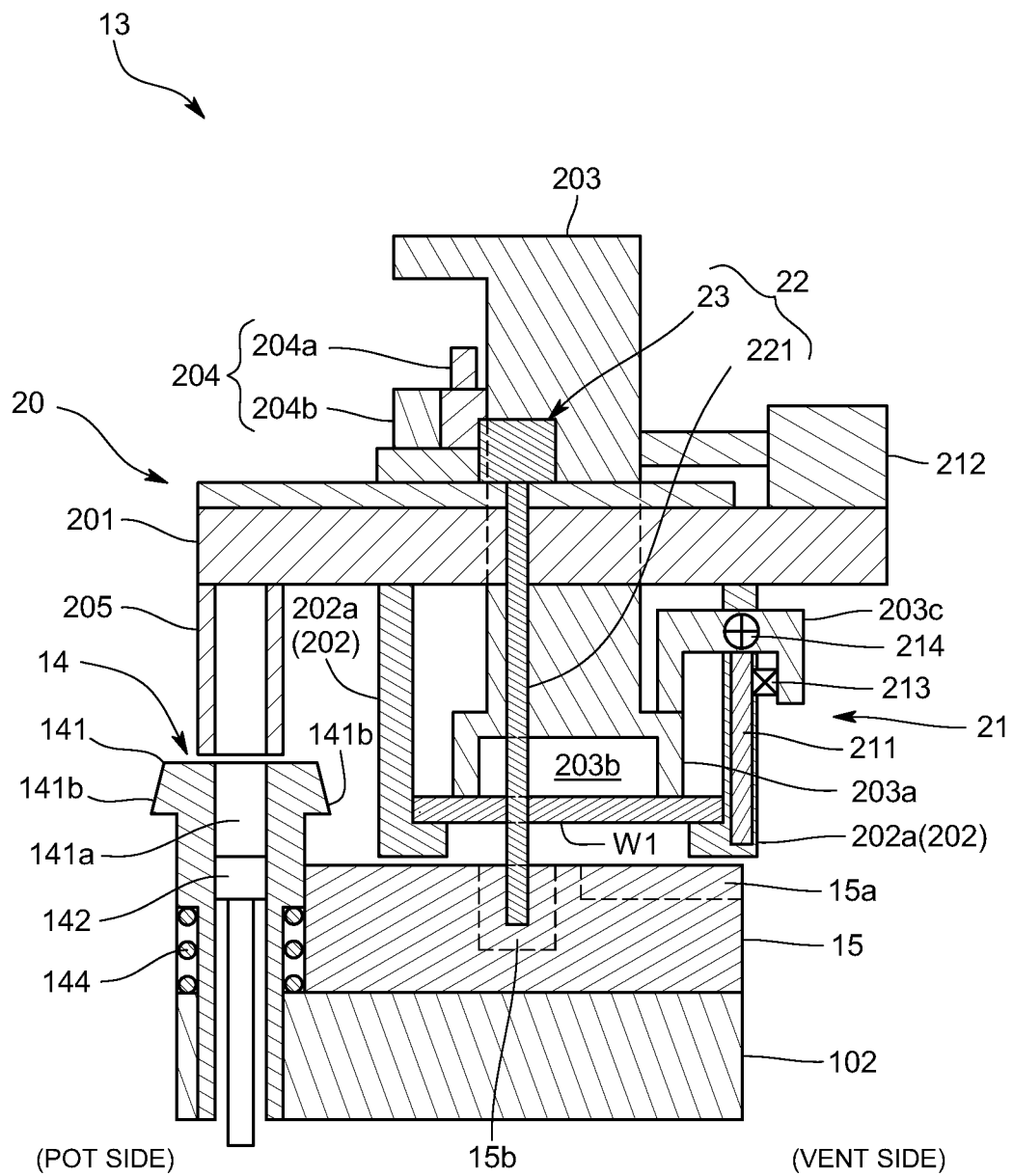
FIG. 7 is a side view schematically showing a state in which a conveying apparatus is holding a substrate of the same embodiment.

As is shown in FIG. 7 and the like, the loader 13 is provided with a holding unit 20 that holds the objects being molded W1 and transfers them onto the lower mold 15, a first moving mechanism 21 that moves the objects being molded W1 which have been placed on the lower mold 15 in a first direction towards the cull block 141 side (hereinafter, referred to simply as the 'pot side'), and a second moving mechanism 22 that moves the objects being molded W1 which have been placed on the lower mold 15 in a second direction that is different from the first direction.

As is shown in FIG. 7, the holding unit 20 is provided with a base component 201 that is provided so as to be able to move along rails, a holding mechanism 202 that is provided in the base component 201 and holds the objects being molded W1, a pressing component 203 that presses the objects being molded W1 that have been placed on the lower mold 15, and a vertical movement mechanism 204 that moves the pressing component 203 vertically up or down. In addition, a resin holding portion 205 that holds the resin material J is also provided in the base component 201.

Figure 9:
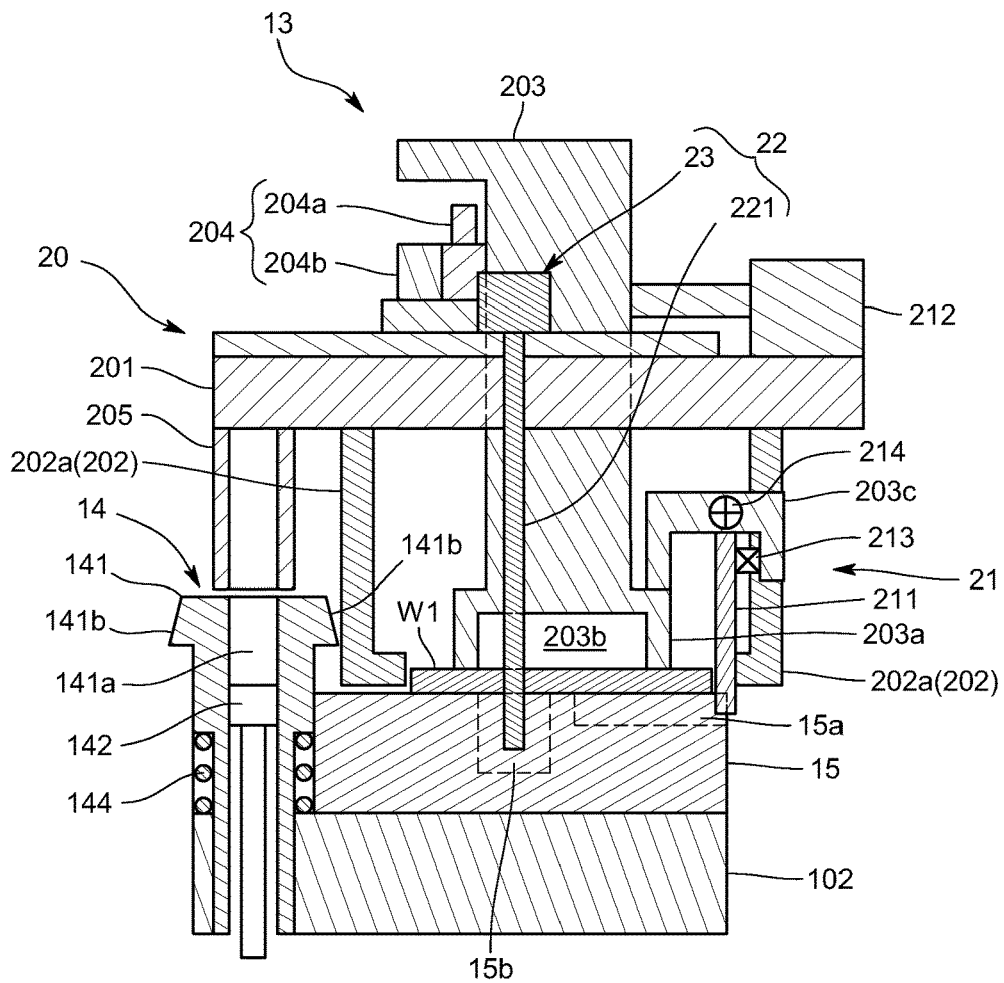
FIG. 9 contains a side view and a plan view that schematically show a state in which the conveying apparatus of the same embodiment has placed a substrate and a pressing component on a lower mold.
Figure 9:
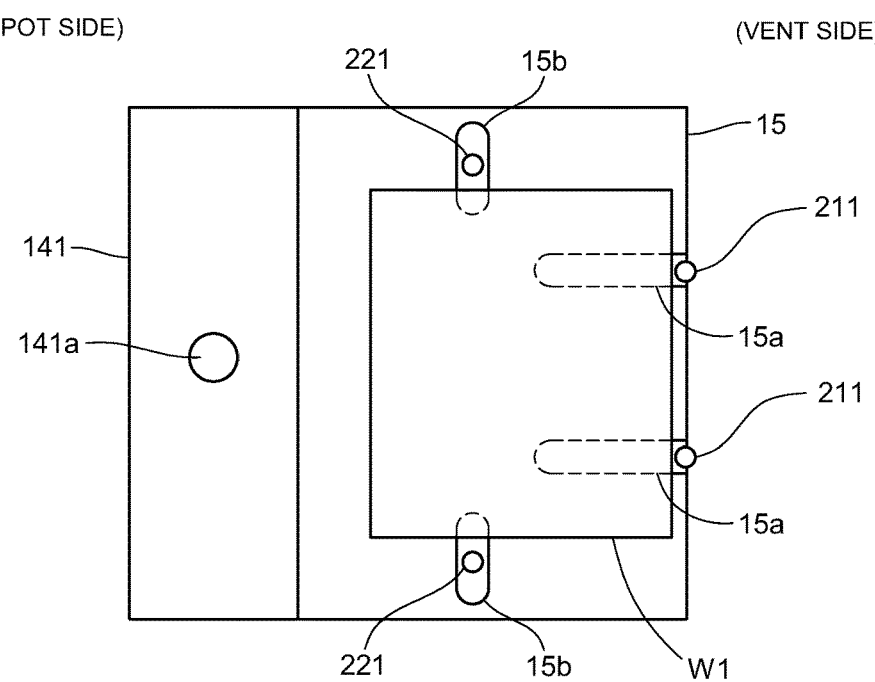
Figure 10:
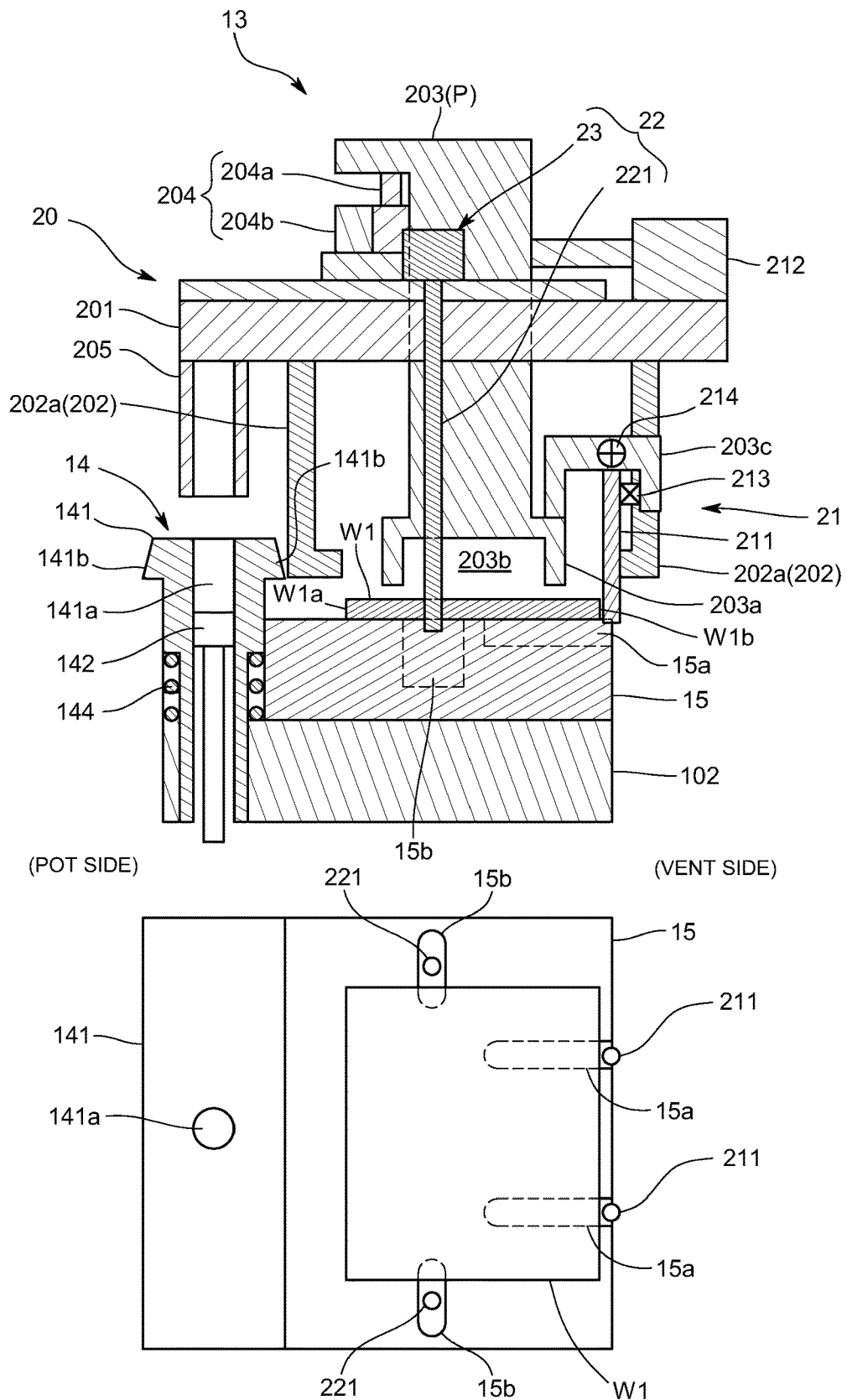
FIG. 10 contains a side view and a plan view that schematically show a state in which the pressing component is in a position of proximity in the conveying apparatus of the same embodiment.

As is shown in FIG. 7, FIG. 9, and FIG. 10, the holding mechanism 202 has a pair of conveying claws 202a that hold the objects being molded W1 by grasping both end portions thereof, and a drive portion (not shown in the drawings) that widens or shortens the distance between the conveying claws 202a. The object being molded W1 is grasped and held as a result of the distance between the conveying claws 202a being shortened by the drive portion, and the holding of the object being molded W1 is released as a result of the distance between the conveying claws 202a being widened by the drive portion. As is shown in FIG. 7, in a state in which the object being molded W1 is being grasped and held by the conveying claws 202a, the holding mechanism 202 of the present embodiment is also holding the pressing component 203 as well as the object being molded W1. In other words, the pressing component 203 is held in a state in which it is placed on the upper surface of the object being molded W1 that is being held by the conveying claws 202a. Note that it is also possible for the holding mechanism 202 to be formed so that it does not hold the pressing component 203.

As is shown in FIG. 7 and the like, any flexure of the object being molded W1 is inhibited as a result of the pressing component 203 pressing against outer peripheral edge portions of the object being molded W1. More specifically, a pressing portion 203a that is in contact with outer peripheral edge portions of the object being molded W1 is provided on a lower surface of the pressing component 203, and a recessed portion 203b that houses the electronic components Wx that have been mounted on the object being molded W1 is also formed in the lower surface of the pressing component 203.

As is shown in FIG. 7 and the like, the vertical movement mechanism 204 is provided on the base component 201 and adjusts a height position of the pressing component 203 relative to the object being molded W.

More specifically, the vertical movement mechanism 204 has a first vertical movement portion 204a that raises or lowers the pressing component 203 vertically between a proximity position P (see FIG. 10 through FIG. 12) where the pressing component 203 is close to the object being molded W, and a pressing position Q (see FIG. 13) where the pressing component 203 is pressing against the object being molded W, and a second vertical movement portion 204b that raises or lowers the pressing component 203 vertically between the proximity position P and a retraction position R (see FIG. 14) that is above the proximity position P, and is a position where the pressing component 203 and the electronic components Wx are not in contact with each other when the resin material J is being loaded. The first vertical movement portion 204a and the second vertical movement portion 204b may be formed, for example, using air cylinders.

As is shown in FIG. 7 and the like, the first moving mechanism 21 positions the object being molded W1 that has been placed on the lower mold 15 by causing it to make a sliding movement towards the pot side, in other words, in the first direction.

More specifically, the first moving mechanism 21 is provided in the holding unit 20 so as to be able to move in the first direction, and has a first contact portion 211 that is in contact with the object being molded W1, and a first drive portion 212 that causes the first contact portion 211 to move in the first direction.

The first contact portion 211 of the present embodiment is provided in the pressing component 203, and comes into contact with a vent-side end portion of the object being molded W1. The first contact portion 211 may be formed, for example in a rod shape. The first drive portion 212 causes the first contact portion 211 to move in the first direction by causing the pressing component 203 to move in the first direction. An air cylinder, for example, may be used to form the first drive portion 212.

As a result of the first contact portion 211 being moved in the first direction by the first drive portion 212, a pot-side end surface W1a of the object being molded W1 comes into contact with an end surface of the cull block 141 so as to position the object being molded W1. As a result of the object being molded W1 being moved in the first direction, the pot-side end surface W1a thereof comes into contact with the side surface on the lower side of the protruding portion 141b of the cull block 141 (see FIG. 11 and FIG. 12).

Figure 11:
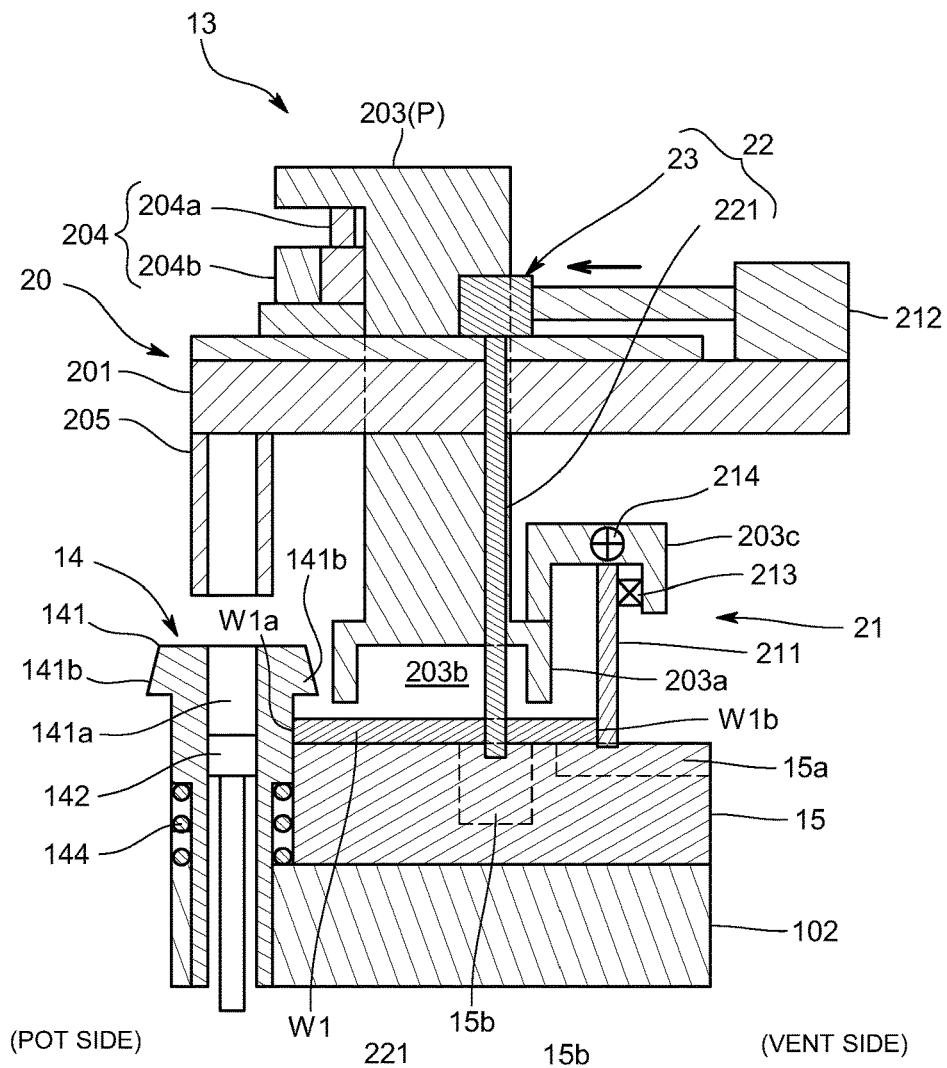
FIG. 11 contains a side view and a plan view that schematically show a state partway through a positioning of a substrate by the conveying apparatus of the same embodiment.
Figure 11:
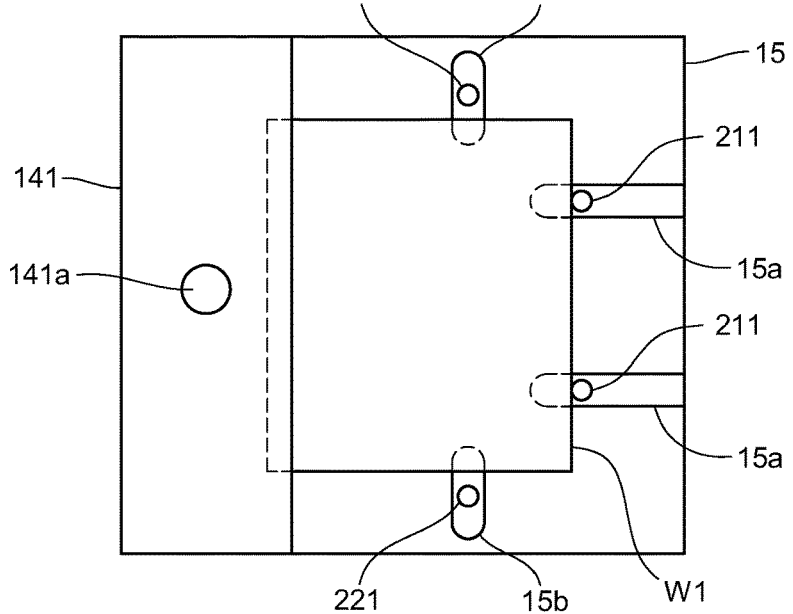

In addition, a plurality (two are shown in FIG. 11 and the like) of the first contact portions 211 are provided in a width direction which is orthogonal to the first direction. The first contact portion 211 is formed such that an upper end portion thereof is linked to a rotating component 214 that is capable of rotating inside the pressing component 203, and such that a lower end portion thereof is in contact with a vent-side end surface W1b of the object being molded W1. Note that, as is shown in FIG. 11 and the like, in order that there is no obstruction to the movement of the first contact portion 211, a first clearance groove 15a is formed in the lower mold 15 within the range of movement of at least the lower end portion of the first contact portion 211.

Furthermore, as is shown in FIG. 7 and the like, the first moving mechanism 21 also has a first elastic component 213 that is elastically deformed as a result of the movement in the first direction of the first contact portion 211, so as to urge the first contact portion 211 towards the pot side. The first elastic component 213 of the present embodiment is provided between the first contact portion 211 and a supporting portion 203c of the pressing component 203 that supports the first contact portion 211. This first elastic component 213 is provided on the vent side relative to the first contact portion 211, and after the first contact portion 211 has come into contact with the object being molded W1, the first elastic component 213 absorbs the travel of the first drive portion 212 and the resulting elastic force causes the pot-side end surface W1a of the object being molded w1 to be pressed against the end surface of the cull block 141 (see FIG. 12).

As is shown in FIG. 9 through FIG. 12, the second moving mechanism 22 positions the object being molded W1 that has been placed on the lower mold 15 by causing it to make a sliding movement in the second direction which is orthogonal to the first direction. The second moving mechanism 22 of the present embodiment is able to position the object being molded W1 by sandwiching it in the second direction.

More specifically, the second moving mechanism 22 is provided in the holding unit 20 so as to be able to move in the second direction, and has a second contact portion 221 that is in contact with the object being molded W1. The second contact portion 221 may be formed, for example in a rod shape. In the present embodiment, a single second contact portion 221 is provided respectively at both sides of the object being molded W1 in the second direction. Note that, as is shown in FIG. 10 and the like, in order that there is no obstruction to the movement of the second contact portion 221, a second clearance groove 15b is formed in the lower mold 15 within the range of movement of a lower end portion of the second contact portion 221.

The second contact portion 221 is formed such that it can be moved in the second direction using the first drive portion 212 of the first moving mechanism 21. More specifically, as is shown in FIG. 8, a cam portion 23 that converts movement in the first direction that is generated by the first drive portion 212 into movement in the second direction is provided between the second contact portion 221 and the first drive portion 212.

Figure 8:
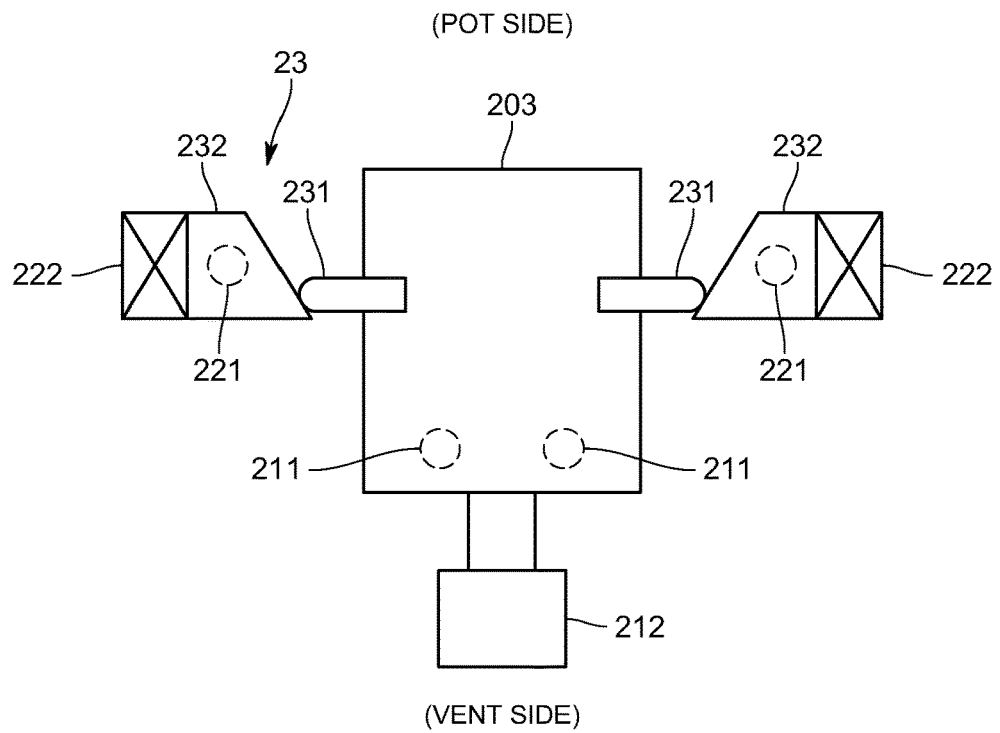
FIG. 8 is a schematic view showing a structure and an operation of a cam portion of the same embodiment.
Figure 8:
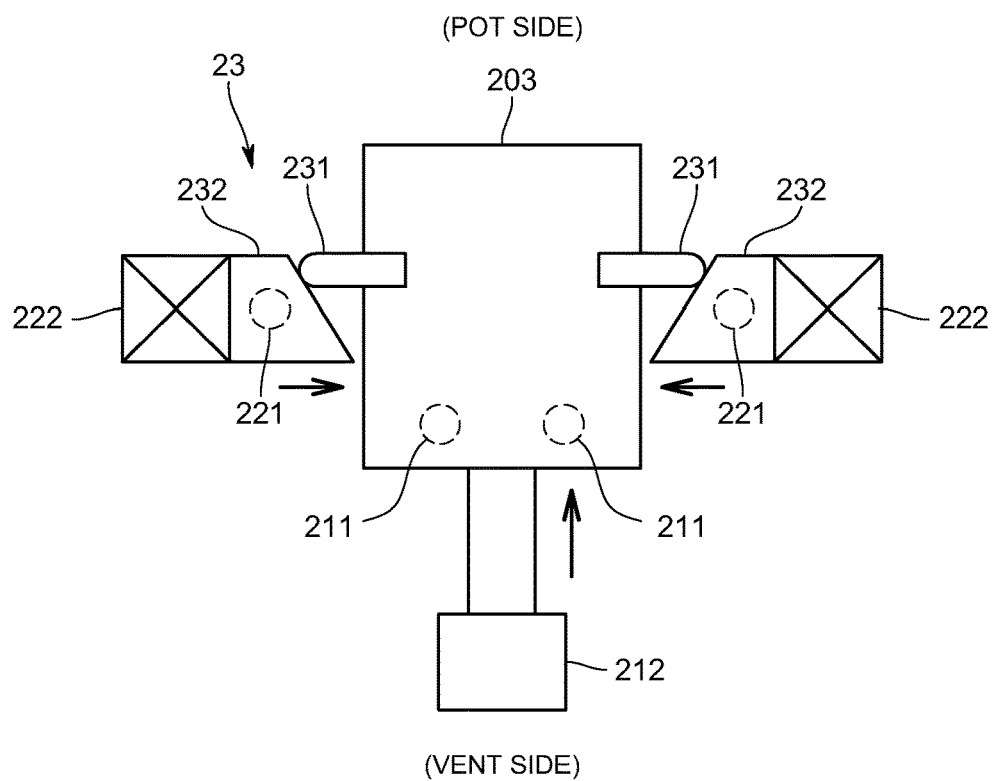

As is shown in FIG. 8, the cam portion 23 has a cam driver 231 that is moved in the first direction by the first drive portion 212, and a cam slider 232 that is moved in the second direction in conjunction with this movement of the cam driver 231. The cam driver 231 of the present embodiment is provided in the pressing component 203 which moves in the first direction. The cam slider 232 is provided at an upper end portion of the second contact portion 221, and is provided so as to be able to move in the second direction in the base component 201. This cam slider 232 has an inclined surface that faces towards the pot side, and the cam slider 232 is formed such that it slides along this inclined surface.

The second moving mechanism 22 also has a second elastic component 222 that is elastically deformed as a result of the movement in the second direction of the second contact portion 221, so as to urge the second contact portion 221 towards the object being molded W1 side. The second elastic component 222 of the present embodiment urges the second contact portion 221 towards the object being molded side by urging the cam slider 232 towards the object being molded side.

If this type of structure is employed, then as a result of the cam driver 231 moving towards the pot side, the cam slider 232 is urged by the second elastic component 222 so as to move towards the object being molded side. In other words, in conjunction with the first moving mechanism 21 moving the first contact portion 211 towards the pot side so as to position the object being molded W1 in the first direction, the second contact portion 221 is moved towards the inner side so as to position the object being molded W1 in the second direction.

[Operations of the Loader 13]

Next, conveying operations and positioning operations performed by the loader 13 will be described with reference to FIG. 7, and FIG. 9 through FIG. 14.

Firstly, as is shown in FIG. 7, after the loader 13 has been moved to a position above the lower mold 15, the object being molded W1 is lowered to a predetermined position prior to being placed on the lower mold 15. In this state, as is shown in FIG. 9, the distance between the conveying claws 202 is widened so that the hold on the object being molded W1 and the pressing component 203 by the holding mechanism 202 is released, and the object being molded W1 and the pressing component 203 are placed on the lower mold 15. Thereafter, in order to ensure that the electronic components Wx of the object being molded W1 that has been placed on the lower mold 15 do not come into contact with the conveying claws 202a, as is shown in FIG. 10, the lower mold 15 is lowered. At this time, as a result of the pressing component 203 hitting against the first vertical movement portion 204a of the vertical movement mechanism 204, the pressing component 203 is placed in the proximity position P which is close to the object being molded W1 that has been placed on the lower mold 15. Note that it is also possible to employ a structure in which, after the hold by the holding mechanism 202 has been released, the pressing component 203 is placed in the proximity position P by hitting against the first vertical movement portion 204a without being placed on the lower mold.

Figure 12:
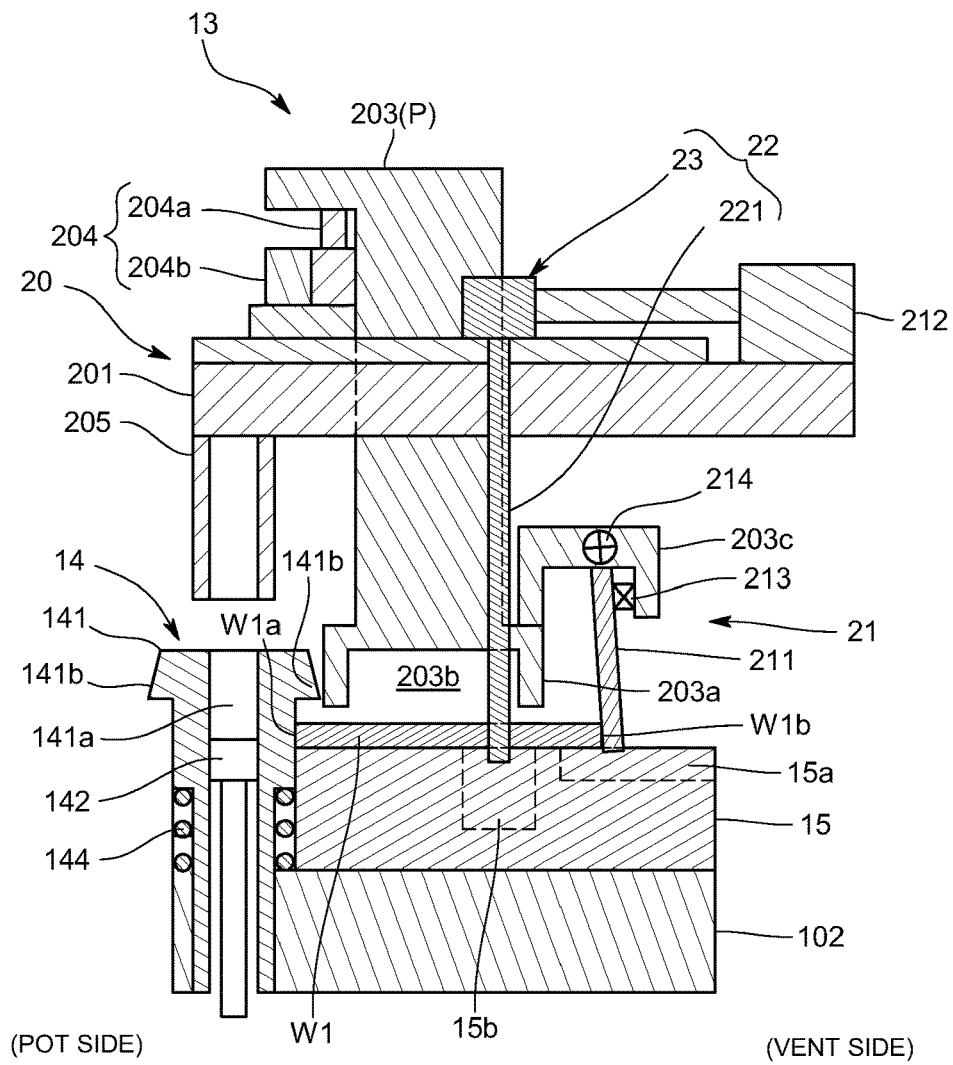
FIG. 12 contains a side view and a plan view that schematically show a state in which a substrate has been positioned by the conveying apparatus of the same embodiment.
Figure 12:
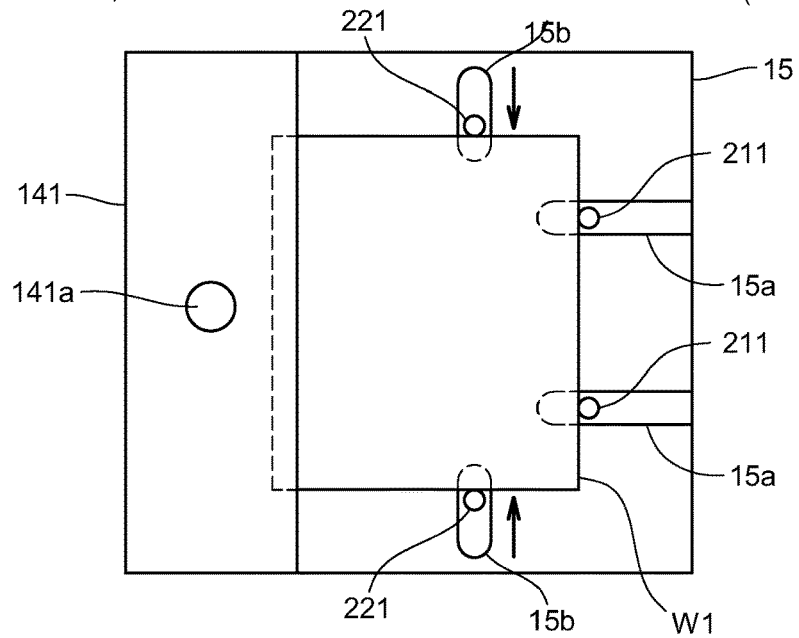

Next, as is shown in FIG. 11 and FIG. 12, the pressing component 203 is moved in the first direction towards the pot side by the first moving mechanism 21. As a result of this movement in the first direction, the pot-side end surface W1a of the object being molded W1 comes into contact with the end surface of the cull block 141, and the first elastic component 213 is elastically deformed so that the first contact portion 211 presses the object being molded W1 against the cull block 141. Note that the vertical movement mechanism 204 also moves in the first direction in conjunction with this movement in the first direction of the pressing component 203. At this time, the object being molded W1 and the electronic components Wx are heated by the lower mold, whose temperature has been raised, and there may be cases in which the object being molded W1 becomes deformed (i.e., warped) because of differences between the respective coefficients of thermal expansion thereof. In the present embodiment, by positioning the pressing component 203 in the proximity position P, it is possible to inhibit deformation of the object being molded W1.

Moreover, as is shown in FIG. 11 and FIG. 12, the cam portion 23 operates in conjunction with the movement in the first direction of the pressing component 203 that is caused by the first moving mechanism 21, and the second contact portion 221 of the second moving mechanism 22 is moved towards the inner side so that the object being molded W1 is positioned in the second direction. The second contact portion 221 is pressed against the end surface in the second direction of the object being molded W1 by elastic force from the second elastic component 233.

Figure 13:
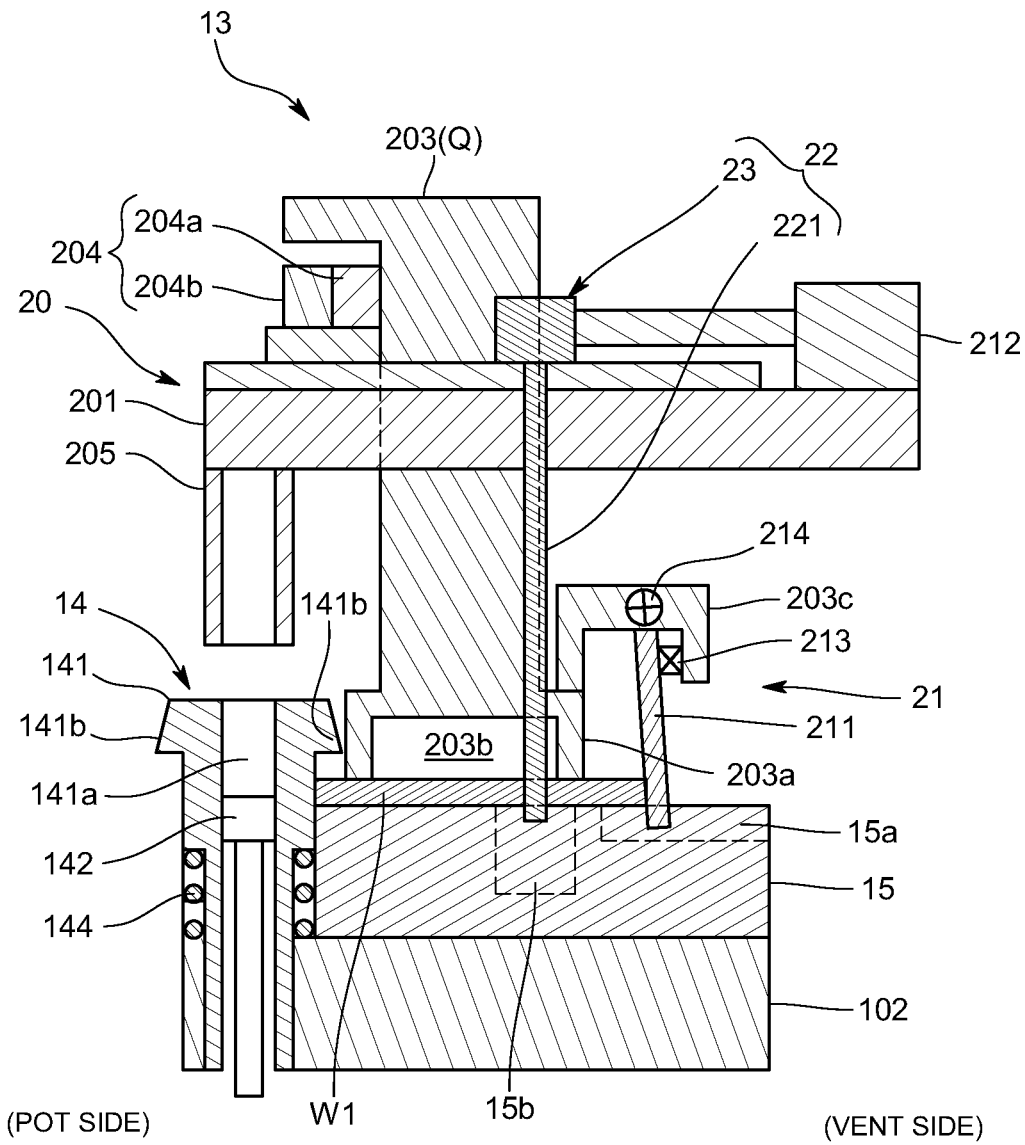
FIG. 13 is a plan view schematically showing a state in which the pressing component has been placed in a pressing position by the conveying apparatus of the same embodiment.

Thereafter, as is shown in FIG. 13, the first vertical movement portion 204a of the vertical movement mechanism 204 moves the pressing component 203 from the proximity position P to the pressing position Q, so that the pressing component 203 comes into contact with and presses against the outer peripheral edge portion of the previously positioned object being molded W1. In this state, the object being molded W1 is held by suction on the lower mold 15 by a suction mechanism (not shown in the drawings) that is provided in the lower mold 15. In the present embodiment, even in cases in which the object being molded W1 has become deformed, because the object being molded W1 is being pressed by the pressing component 203, it can be held in place by suction. Once the object being molded W1 is held in place by suction, the first vertical movement portion 204a raises the pressing component 203 from the pressing position Q to the proximity position P. In addition, as a result of the first drive portion 212 of the first moving mechanism 21 restoring the pressing component 203 to its initial position which it occupied before it was pushed out, the first contact portion 211 is separated from the object being molded W1, and the second contact portion 221 is separated from the object being molded W1 by the cam portion 23.

Figure 14:
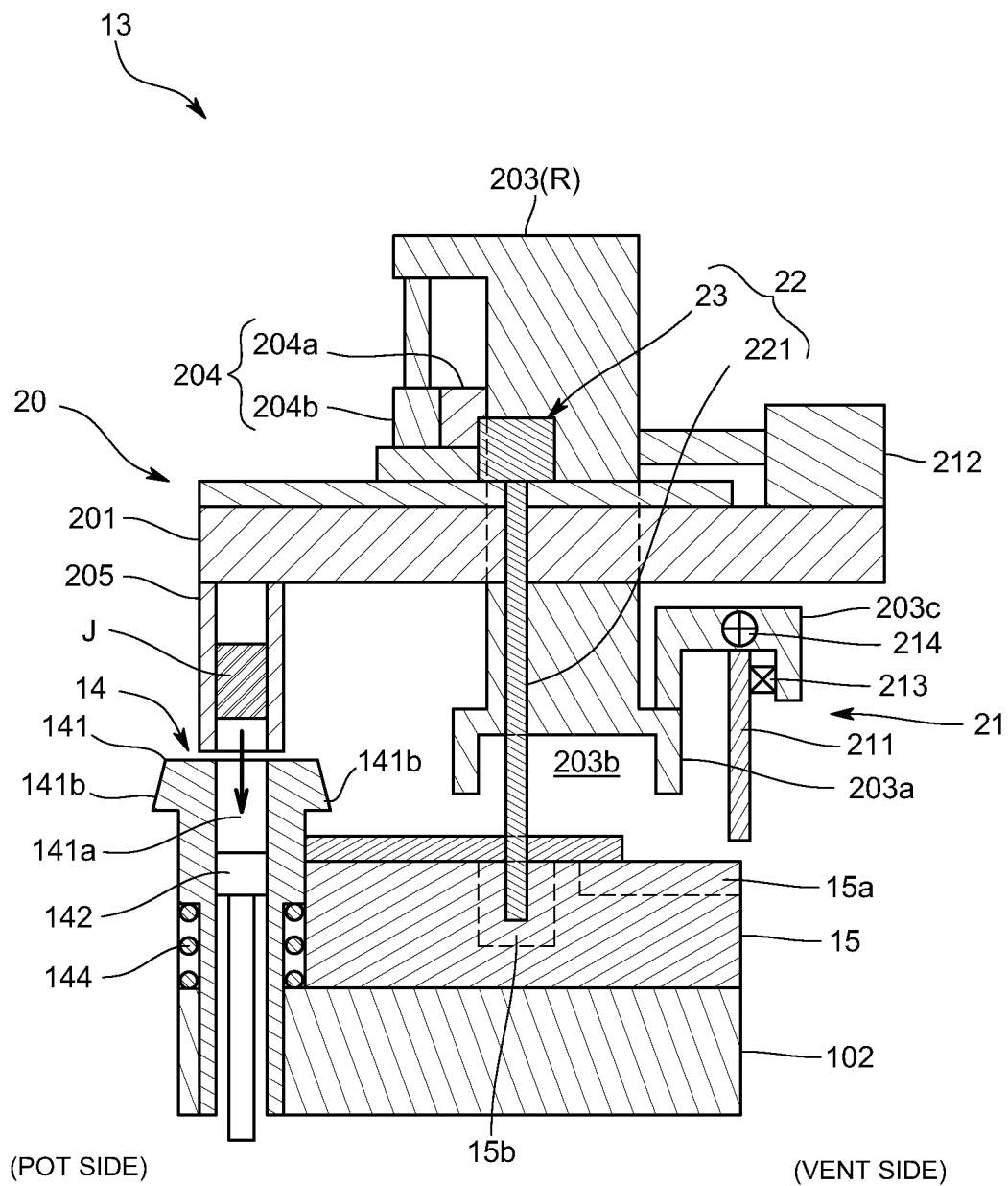
FIG. 14 is a side view schematically showing a state in which resin material has been supplied to a cull block by the conveying apparatus of the same embodiment.

After this series of positioning operations has been performed, the loader 13 moves to the resin material supply portion 12, and holds the resin material J using the resin holding portion 205. Once it is holding the resin material J, as is shown in FIG. 14, the loader 13 once again moves to a position above the lower mold 15, and places the resin material J into the pot 141a of the cull block 141. At this time, the second vertical movement portion 204b of the vertical movement mechanism 204 raises the pressing component 203 to the retraction position R which is above the proximity position P. As a result, in the supply operation performed by the resin holding portion 205 to supply the resin material J to the cull block 141, the pressing component 203 can be prevented from coming into contact with the object being molded W1 and the like.

[Effects of the Present Embodiment]

According to the resin molding apparatus 100 of the present embodiment, because the conveying apparatus 13 has the first moving mechanism 21 that moves the object being molded W1 in the first direction towards the cull block 141 side, and the second moving mechanism 22 that moves the object being molded W1 in the second direction which is different from the first direction, it is possible to position the object being molded W1 relative to the lower mold 15 without having to provide positioning pins in the lower mold 15 in order to position the object being molded W1, and without having to provide positioning holes in the object being molded W1 in order to position it relative to the lower mold 15.

ADDITIONAL VARIANT EMBODIMENTS

Note that the present invention is not limited to the above-described embodiment.

For example, in the above-described embodiment a structure is employed in which the first drive portion 213 of the first moving mechanism 21 is provided in the pressing component 203 and, by moving the pressing component 203 in the first direction, the first contact portion 211 is moved in the first direction. However, it is also possible to provide the first contact portion 211 in the base component 201 such that the first contact portion 211 is able to move in the first direction, and to enable the first contact portion 211 to be moved by the first drive portion 212. In this case as well, the second contact portion 221 is moved in the second direction via the cam portion 23 which converts the movement in the first direction by the first drive portion 212 into the second direction.

Moreover, in the above-described embodiment, a structure is employed in which the second contact portion 221 of the second moving mechanism 22 is made to move in the second direction using the first drive portion 212 of the first moving mechanism 21. However, it is also possible for the second moving mechanism 22 to have a second drive portion (not shown in the drawings) that moves the second contact portion 221 in the second direction. In this case, the cam portion 23 and the second elastic component 233 can be omitted.

Furthermore, in the above-described embodiment, the vertical movement mechanism 204 of the pressing component 203 is formed by the first vertical movement portion 204a and the second vertical movement portion 204b, however, it is also possible to employ a structure in which the pressing component 203 is moved between the proximity position P, the pressing position Q, and the retraction position R by a single vertical movement portion.

In the above-described embodiment, when moving the object being molded W1, the pressing component 203 is located in the proximity position P, however, it is also possible for the pressing component 203 to move the object being molded W1 while being located in the pressing position Q. In this case, the pressing component 203 is also moved in the first direction and the second direction together with the object being molded W1.

In the above-described embodiment, because the cull block 141 is provided so as to protrude from the upper surface of the lower mold 15, the first moving mechanism 21 positions the object being molded W1 by pressing the end surfaces thereof against the end surfaces of the cull block 141. However, in the case of a structure having a pot block 145 that does not protrude from the upper surface of the lower mold 15, employing the following structure may also be considered.

Figure 15:
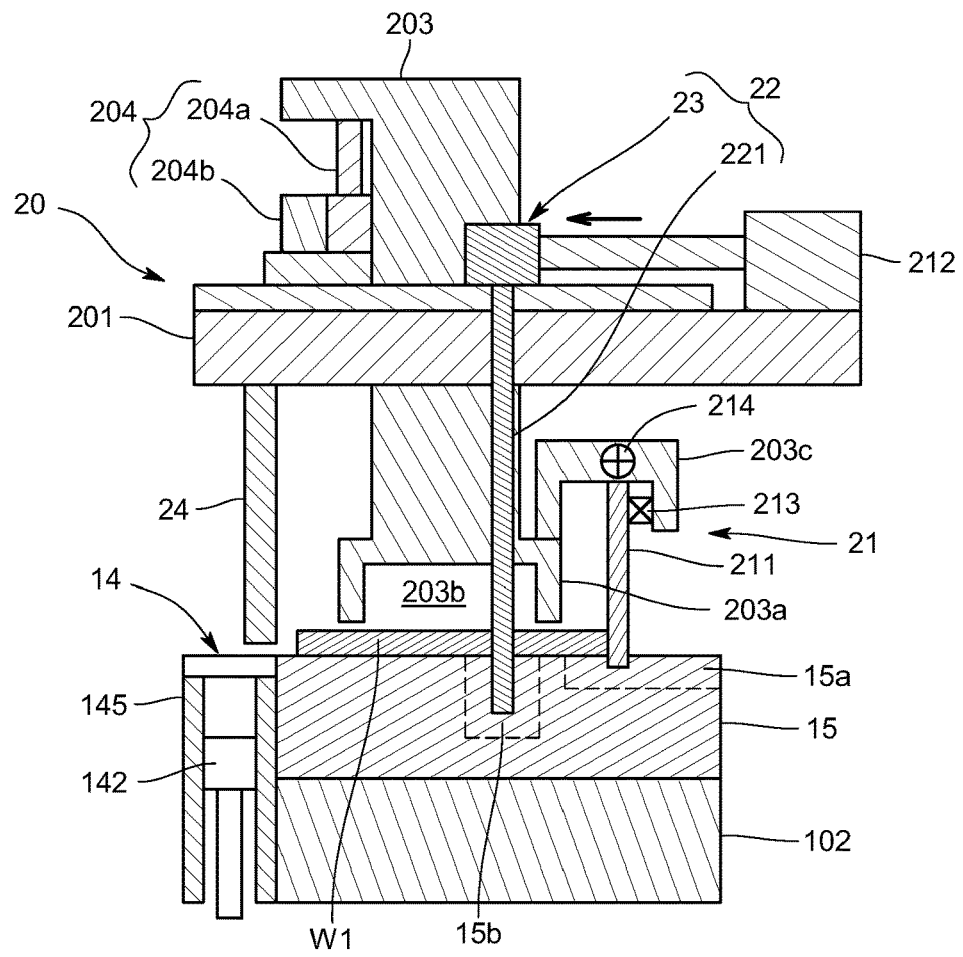
FIG. 15 contains a side view and a plan view that schematically show a conveying apparatus of a variant embodiment.
Figure 15:
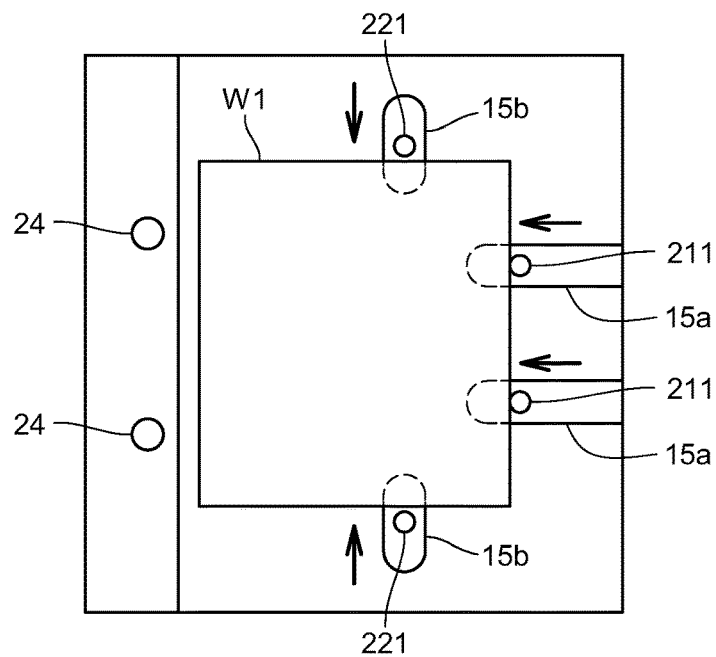

Namely, as is shown in FIG. 15, the conveying apparatus 13 is further provided with a position regulating component 24 that comes into contact with the object being molded W1, which is moved in the first direction by the first moving mechanism 21, so as to regulate the position thereof in the first direction. Providing this position regulating component 24 on the base component 201 of the holding unit 20 may be considered. Moreover, in a state in which the object being molded W1 is to be moved by the first moving mechanism 21, the position regulating component 24 extends to a height position where it is in contact with the pot-side end portion of the object being molded W1. Furthermore, the object being molded W1 that is moved by the first moving mechanism 21 is in a state of protruding onto the pot side beyond the pot-side end portion of the pressing component 203. As a result, the pot-side end portion of the object being molded W1 is positioned in the first direction by coming into contact with an end surface of the position regulating component 24.

Figure 16:
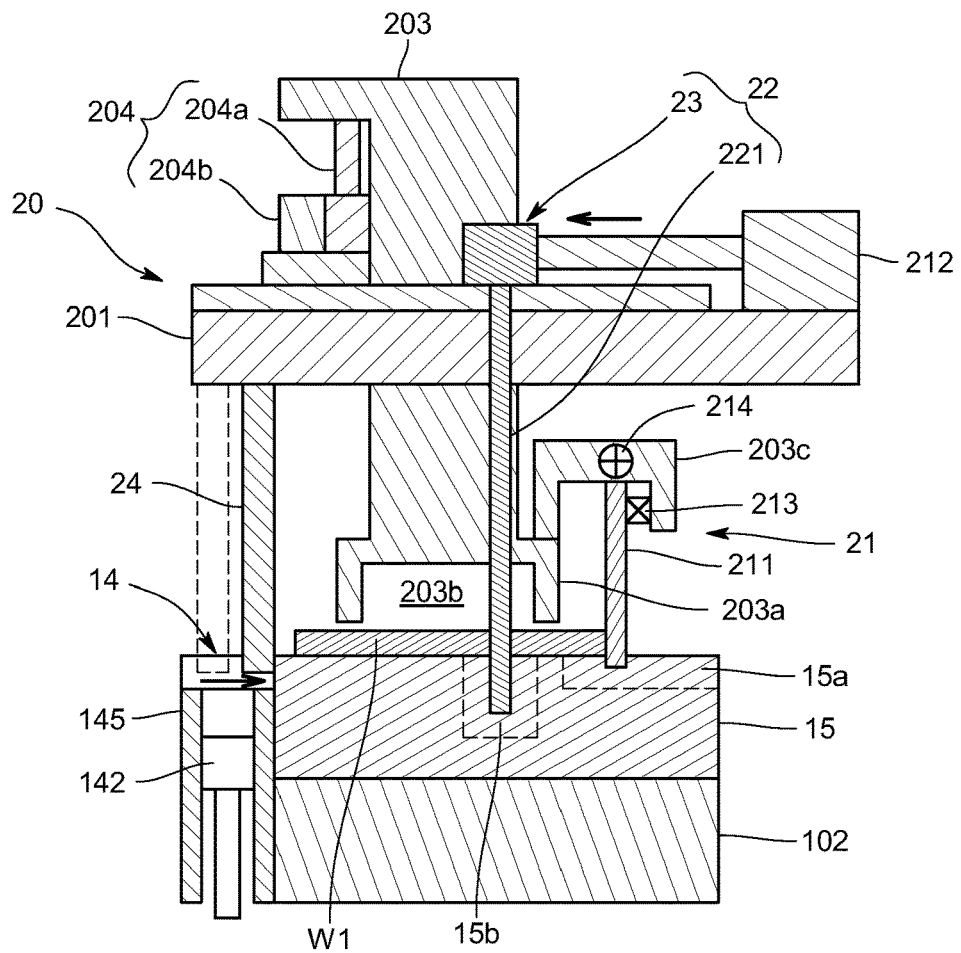
FIG. 16 contains a side view and a plan view that schematically show a conveying apparatus of a variant embodiment.
Figure 16:
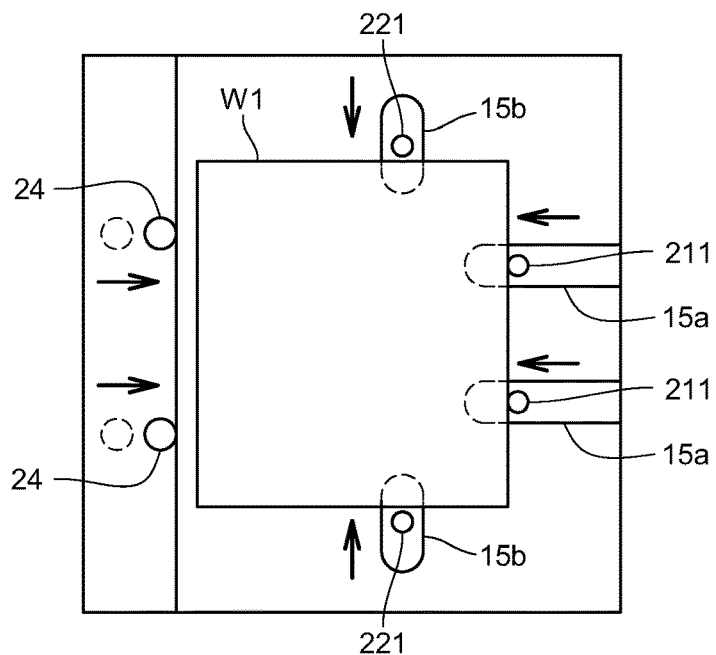

Moreover, as is shown in FIG. 16, it is also possible for the position regulating component 24 to be formed so as to be able to move in the first direction. In this case, the position regulating component 24 is moved by a drive portion (not shown in the drawings) so as to come into contact with an inner surface of the recessed portion 15M of the lower mold 15 in which the pot block 145 is housed. If this type of structure is employed, then the object being molded W1 can be more reliably positioned at a position on the inner surface of the recessed portion 15M.

In the above-described embodiment, the object being molded W1 is positioned relative to the lower mold 15, however, in the case of a structure in which the object being molded W1 is held on the upper mold 16, then it is also possible for the object being molded W1 to be positioned in the first direction and in the second direction on the upper mold 16. In addition, the pair of forming molds are not limited to being an upper mold and a lower mold, and other types of forming molds may also be used.

The resin molding apparatus of the present invention is not limited to being used in transfer molding, and may also be used, for example, in compression molding.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

INDUSTRIAL APPLICABILITY

According to the present invention, it is possible to position an object being molded relative to a forming mold using a conveying apparatus.

What is claimed is:

1. A conveying apparatus that conveys an object being molded to one mold from among forming molds to which a resin material is supplied from a resin injection portion, the forming molds including the one mold onto which the object being molded is placed and another mold positioned to face the one mold, comprising:
   a holding unit configured to hold the object being molded and transfer it to the one mold;
   a first moving mechanism configured to move the object being molded, which is in a state of being placed on the one mold in a first direction towards a resin injection portion side; and
   a second moving mechanism configured to move the object being molded, which is in a state of being placed on the one mold in a second direction that is different from the first direction.

2. The conveying apparatus according to claim 1, wherein
   the first moving mechanism comprises: a first contact portion that is provided in the holding unit and configured to be able to move in the first direction, and come into contact with the object being molded; and a first drive portion configured to cause the first contact portion to move in the first direction, and
   the second moving mechanism comprises: a second contact portion that is provided in the holding unit and configured to be able to move in the second direction, and come into contact with the object being molded; and a second drive portion configured to cause the second contact portion to move in the second direction.

3. The conveying apparatus according to claim 1, wherein
   the first moving mechanism comprises: a first contact portion that is provided in the holding unit and configured to be able to move in the first direction, and come into contact with the object being molded; and a first drive portion configured to cause the first contact portion to move in the first direction, and
   the second moving mechanism comprises a second contact portion that is provided in the holding unit and configured to be able to move in the second direction, and come into contact with the object being molded, and the second moving mechanism being configured to use the first drive portion to move the second contact portion in the second direction.

4. The conveying apparatus according to claim 3, wherein the second moving mechanism comprises a cam portion configured to convert a movement generated by the first drive portion in the first direction into a movement in the second direction.

5. The conveying apparatus according to claim 2, wherein the first moving mechanism comprises a first elastic component configured to be elastically deformed in conjunction with movement of the first contact portion in the first direction.

6. The conveying apparatus according to claim 2, wherein the second moving mechanism comprises a second elastic component configured to be elastically deformed in conjunction with movement of the second contact portion in the second direction.

7. The conveying apparatus according to claim 1, wherein the first moving mechanism is configured to position the object being molded by placing an end surface thereof in contact with an end surface of the resin injection portion.

8. The conveying apparatus according to claim 1, further comprising a position regulating component configured to regulate a position in the first direction by being in contact with the object being molded which is moved in the first direction by the first moving mechanism.

9. The conveying apparatus according to claim 2, further comprising:
a pressing component configured to press against the object being molded, which is in a state of being placed on to the one mold; and
a vertical movement mechanism configured to raise or lower the pressing component relative to the object being molded, wherein,
the vertical movement mechanism is configured to place the pressing component in contact with the object being molded which is positioned by the first moving mechanism and the second moving mechanism.

10. The conveying apparatus according to claim 9, wherein
the first contact portion is provided in the pressing component, and
the first drive portion is configured to cause the first contact portion to move by causing the pressing component to move in the first direction.

11. The conveying apparatus according to claim 9, wherein
the holding unit comprises a resin holding portion that holds a resin material that is supplied to the resin injection portion, and
when the resin material is being supplied to the resin injection portion, the vertical movement mechanism is configured to move the pressing component to a position where the pressing component is not in contact with the object being molded.

12. A resin molding apparatus comprising the conveying apparatus according to claim 1.

13. A conveying method for an object being molded that employs the conveying apparatus according to claim 1, in which
the object being molded, held by the holding unit, and transferred to the one mold is moved in a first direction towards the resin injection portion side by the first moving mechanism, and the object being molded and held by the holding unit is then positioned in the one mold by being moved in a second direction that is different from the first direction by the second moving mechanism.

14. A manufacturing method in which an electronic component is resin sealed by means of resin molding, comprising:
a positioning step in which, using the conveying apparatus according to claim 1, the object to be molded and being held by the holding unit is positioned in the one mold by the first moving mechanism moving the object to be molded in a first direction and then the second moving mechanism moving the object to be molded in a second direction different from the first direction; and
a molding step in which the object to be molded undergoes resin molding after having been positioned in the one mold.

* * * * *